United States Patent
Jiao

(10) Patent No.: US 9,764,383 B2
(45) Date of Patent: Sep. 19, 2017

(54) LASER TRIMMING SURFACE CLEANING FOR ADHESION TO CAST METALS

(71) Applicant: Continental Automotive Systems, Inc., Auburn Hills, MI (US)

(72) Inventor: Jinbao Jiao, Buffalo Grove, IL (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 309 days.

(21) Appl. No.: 14/504,477

(22) Filed: Oct. 2, 2014

(65) Prior Publication Data

US 2016/0100498 A1    Apr. 7, 2016

(51) Int. Cl.
*B23K 26/16* (2006.01)
*B23K 26/352* (2014.01)
*B23K 26/361* (2014.01)
*B22D 31/00* (2006.01)
*H05K 5/00* (2006.01)
*H05K 5/06* (2006.01)
*B32B 37/18* (2006.01)
*B23K 26/00* (2014.01)

(52) U.S. Cl.
CPC ......... *B22D 31/002* (2013.01); *H05K 5/0052* (2013.01); *H05K 5/0082* (2013.01); *H05K 5/062* (2013.01); *B23K 26/0084* (2013.01); *B23K 26/16* (2013.01); *B23K 26/352* (2015.10); *B23K 26/361* (2015.10); *B32B 37/18* (2013.01)

(58) Field of Classification Search
None
See application file for complete search history.

(56) References Cited

U.S. PATENT DOCUMENTS

2014/0071595 A1    3/2014    De Jong et al.

*Primary Examiner* — Linda L Gray

(57) ABSTRACT

A method bonds a first member to a second member. The method provides a first member having a bonding surface. A second member is molded from a metal material so as to have a surface constructed and arranged to be bonded to the bonding surface. The surface of the second member is laser trimmed to remove material and to remove byproducts, resulting from molding the second member, from the surface of the second member to thereby define a clean, laser trimmed surface of the second member. A sealant is provided between and in contact with the bonding surface and the clean, laser trimmed surface. The sealant is permitted to cure to thereby bond the first member to the second member.

9 Claims, 2 Drawing Sheets

| Treatments | Pull force (1" Al plate from groove) | | | Average (lb) | % Cohesive mode |
|---|---|---|---|---|---|
| | Sample 1 | Sample 2 | Sample 3 | | |
| 1. As received (clear adhesive separation of DCC 6876 from Al groove surface) | 4.3 | 3.2 | 6.9 | 4.8 | 0 |
| 2. As received (clear adhesive separation of DCC 6876 from Al groove surface), then Laser Trimming the groove (100mm / sec, 31A, freq = 9000Hz) | 94.6 | 95.9 | 87.6 | 92.7 | 100 |

US 9,764,383 B2

LASER TRIMMING SURFACE CLEANING FOR ADHESION TO CAST METALS

FIELD

This invention relates to a adhering a first member to cast metal second member and, in particular, to laser trimming a surface of the second member to remove mold byproducts and ensure clean adhesion.

BACKGROUND

With reference to FIG. 1, in conventional transmission control modules for vehicles, a plastic cover 10 is typically bonded to a sealing groove or surface 12 of a cast aluminum base plate or housing 14 using sealant 16. There are frequently reports of leakage into housing due to non-sticking of the sealant to the surface of the aluminum housing. FIG. 1 shows the cover opened with respect to the housing 14. As seen, while the sealant 16 bonds cohesively to the plastic cover 10, the sealant 16 tends to peel-off from the sealing surface 12 of the aluminum housing 14.

Analysis indicates that the surface of the cast aluminum is contaminated with a mold release agent and/or thermally degraded byproducts from the molding process. The contaminants can cause the loss of the adhesion. Tests appear to further indicate that the contaminants either combine chemically to the surface of cast aluminum, or penetrate into the top layer of the cast aluminum during the cast molding process that has the alloy melting temperature of over 600C. A general soap wash from the casting supplier, or even isopropyl alcohol (IPA) wiping is not effective to clean out the residual release agent. More aggressive surface treatment methods were used to see how they could effectively clean out the contaminants from the surface of the cast aluminum groove. The results show that even ultrasonic cleaning, using aggressive solvents (Dichloromethane 10 min+Hexane 10 min), is still not very effective. Furthermore, regular plasma or 5× stronger plasma does not provide a clean enough surface to generate cohesive adhesion.

Testing has also shown that cohesive bonding to the surface of the aluminum can be achieved by an extremely slow speed plasma, or by surface sanding. However, the slow plasma method (1 mm/sec) is too slow and not feasible for mass production. Using higher speed was found to not be effective. Sanding (or shot peening, or sand blasting) the surface will eventually accumulate the contaminant on the surface of the sand or metal beads, which could cross-contaminant the surface of the aluminum after using this method over time.

Thus, there is a need to remove a top layer of a surface of cast metal by laser trimming to clean the surface and ensure adhesion of a sealant to the cleaned surface.

SUMMARY

An objective of the invention is to fulfill the need referred to above. In accordance with the principles of an embodiment, this objective is achieved by a method of bonding a first member to a second member. The method provides a first member having a bonding surface. A second member is molded from metal material so as to have a surface constructed and arranged to be bonded to the bonding surface. The surface of the second member is laser trimmed to remove material and to remove byproducts, resulting from molding the second member, from the surface of the second member to thereby define a clean, laser trimmed surface of the second member. A sealant is provided between and in contact with the bonding surface and the clean, laser trimmed surface. The sealant is permitted to cure to thereby bond the first member to the second member.

Other objectives, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF AN EXEMPLARY EMBODIMENT

Figure 1:
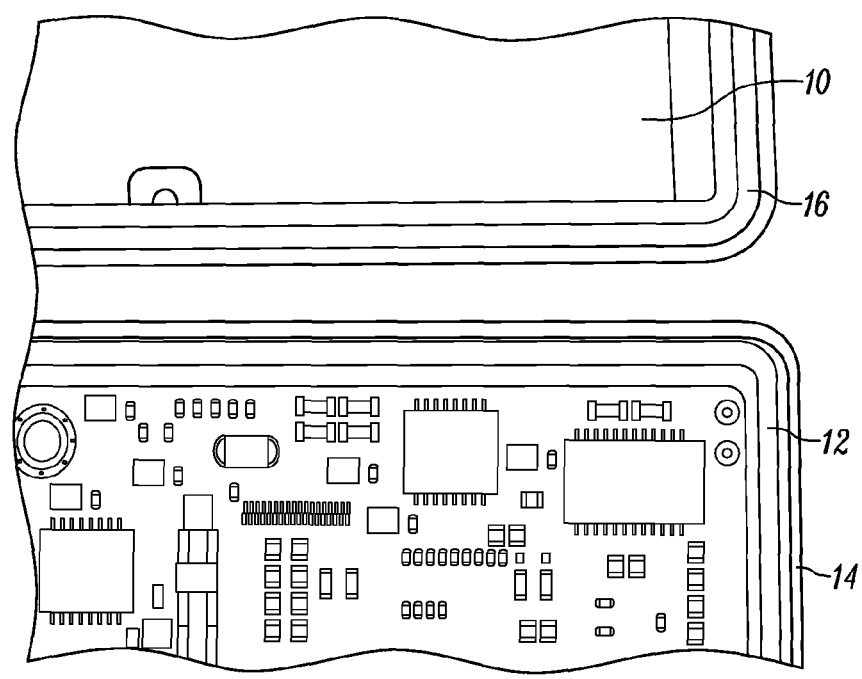
FIG. 1 is a view of a portion of a conventional transmission control module showing sealant peeled-off of a surface of a cast aluminum housing and adhered to a plastic cover.
Figure 2:
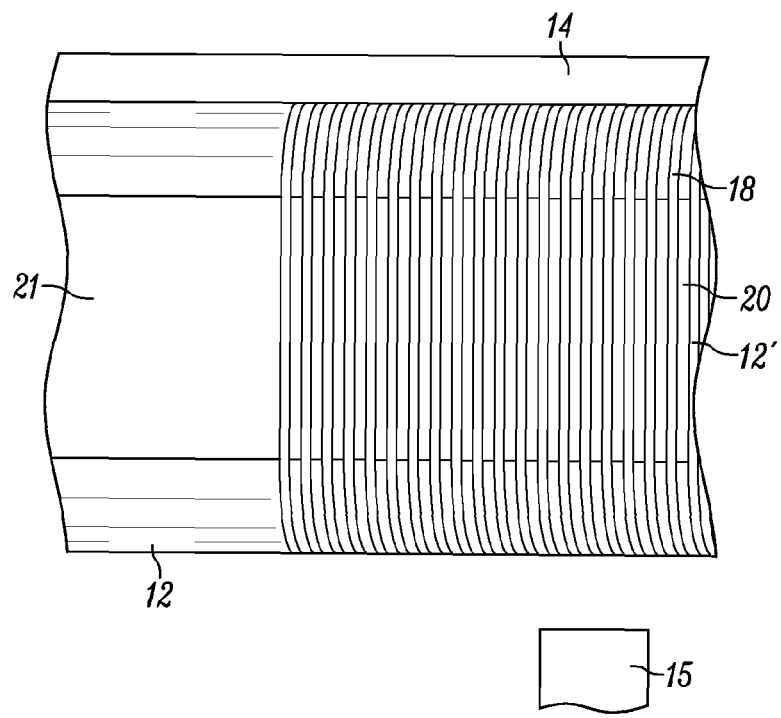
FIG. 2 is an enlarged, partial view of a surface of the cast aluminum housing of FIG. 1, shown after partially treating the surface with a laser trimming operation in accordance with an embodiment.
Figures 3, 4:
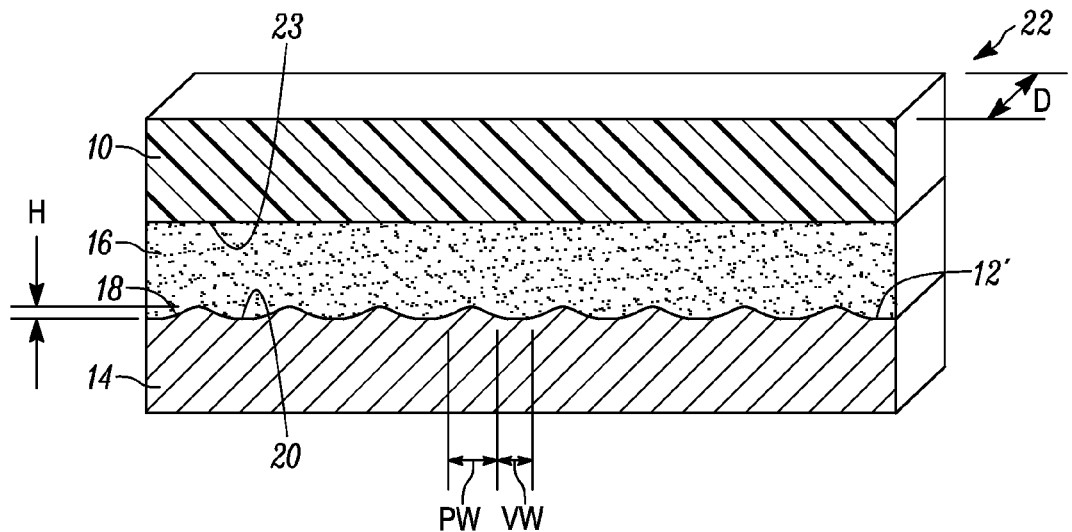
FIG. 3 is a cross-sectional view showing a plastic cover bonded to a laser-trimmed surface of a cast aluminum housing using a sealant in accordance with an embodiment.
FIG. 4 is a table showing pull forces of samples where the surface of the cast aluminum housing was not laser trimmed as compared to pull forces of samples where the surface of the cast aluminum housing was laser trimmed.

With reference to FIG. 2, a portion of the surface 12 of member 14 (e.g. housing) molded from cast aluminum material is shown after laser trimming (ablation) to remove a top layer of the surface 12 and thus provide a clean, laser trimmed surface 12' for the housing 14, in accordance with an embodiment. A laser 15 was operated at about 100 mm/sec, 31 Amps and at a frequency of about 9000 Hz to achieve surface 12'. The preferred frequency range is 5,000 to 50,000 Hz. The laser trimmed surface 12' is provided about a periphery of the housing 14 or everywhere that is in contact with the sealant 16 (see FIG. 1). As shown in FIGS. 2 and 3, the laser trimming defines a wave patterned surface 12' having alternating peaks 18 and valleys 20. In the embodiment, the peaks 18 and valleys 20 are preferably defined substantially in a uniform manner on surface 12'. The peak width PW is preferably 20 to 200 μm. The valley width VW is preferably 20 to 200 μm. The total line distance D is preferably 40 to 400 μm. The height H peak to valley is preferably 40 to 400 μm. The laser trimming removes material from surface 12 and thus removes a mold release agent and/or thermally degraded byproducts 21 or contaminants that result from the process of molding the cast aluminum housing 14.

FIG. 3 shows a cross-sectional view of a portion of a transmission control module, generally indicated at 22, with a bonding surface 23 of a first member in the form of a plastic cover 10 bonded, using sealant 16, to the surface 12' of the second member in the form of a cast aluminum housing 14. The sealant 16 is preferably a platinum cure silicone adhesive such as Dow Corning® 3-6876, cured at 140 C for one hour.

Although cast aluminum material has been disclosed as the material of the laser trimmed surface 12' needed to be cleaned for better adhesion, the laser trimming described herein can be applied to any surface of a cast or molded metal or metal alloy. As used herein, "metal" includes metal alloys.

With reference to FIGS. 2 and 3, a method of bonding the first member 10 to the second member 14 provides the first member 10 (e.g., cover) with a bonding surface 23. The second member 14 (e.g., housing) is provided so as to be molded from metal material and has a surface 12 constructed and arranged to be bonded to the bonding surface 23. A laser trimming process is performed on the surface 12 of the second member 14 to remove material and byproducts, resulting from molding the second member, from the surface of the second member to thereby define a clean, laser trimmed surface 12' of the second member. The sealant 16 is provided between and in contact with the bonding surface 23 and the laser trimmed surface 12'. The sealant 16 is permitted or caused to cure, thereby bonding the first member 10 to the second member 14.

FIG. 4 is a table showing pull forces of samples 1-3 of Treatment 1 which is the conventional, non-cleaned (non-laser trimmed) surface 12 of the cast aluminum housing 14. The average pull force of Treatment 1 is 4.8 lbs. Treatment 2 shows pull forces of samples 1-3 where the surface 12' of the cast aluminum housing was laser trimmed and thus cleaned in accordance with the embodiment. Since the surface 12' is clean and thus free of the molding byproducts, the average pull force of Treatment 2 was about 92.7 lbs., a significant improvement as compared to Treatment 1.

The laser trimming (at about 100 mm/sec) to define clean surface 12' is significantly fast and thus can be used in mass-production. Also, since no sand or beads used to provide clean surface 12', there can be no cross-contamination and also no need to clean the beads as in a shot peening process. The laser trimming completely cleans the bonding surface to generate cohesive bonding surface 12', which a soap or solvent wash cannot adequately clean. The laser trimming process is also easy to implement and is less expensive than alternative surface cleaning methods.

Although a transmission control module 22 is disclosed in the embodiment, the clean, laser trimmed surface 12' can be provided in any device where a cast metal surface is to be cleaned and bonded to a surface of another member.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

What is claimed is:

1. A method of bonding a first member to a second member, the method comprising:
    providing a first member having a bonding surface,
    providing a second member molded from a metal material so as to have a surface constructed and arranged to be bonded to the bonding surface of the first member,
    laser trimming, using a laser at a trimming speed of about 100 mm/sec, 31 Amps and a frequency of about 9000 Hz, the surface of the second member to remove material and to remove byproducts, resulting from molding the second member, from the surface of the second member to thereby define a clean, laser trimmed surface of the second member, and
    providing a sealant between and in contact with the bonding surface of the first member and the clean, laser trimmed surface, the sealant configured to cure to thereby bond the first member to the second member.

2. The method of claim 1, wherein the first member is provided as a cover and the second member is provided as a housing of a transmission control module for a vehicle.

3. The method of claim 2, wherein the cover is composed of plastic material and the housing is cast aluminum.

4. The method of claim 1, wherein the step of laser trimming to remove the byproducts removes at least a mold release agent from the surface of the second member.

5. The method of claim 1, wherein the step of laser trimming to remove the byproducts removes thermally degraded contaminants from the surface of the second member.

6. The method of claim 1, wherein the step of laser trimming defines a plurality of alternating peaks and valleys in the clean, laser trimmed surface.

7. The method of claim 6, wherein the peaks and valleys are defined substantially in a uniform manner.

8. The method of claim 7, wherein each peak width is about 20 to 200 μm, each valley width is about 20 to 200 μm, and a height from peak to valley is about 20 to 200 μm.

9. The method of claim 1, wherein the sealant is provided as a platinum cure silicone adhesive.

\* \* \* \* \*